(12) United States Patent
Lee

(10) Patent No.: US 6,323,092 B1
(45) Date of Patent: Nov. 27, 2001

(54) METHOD FOR FORMING A SHALLOW TRENCH ISOLATION

(75) Inventor: Hao-Ming Lee, Taichung Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/466,161

(22) Filed: Dec. 18, 1999

(30) Foreign Application Priority Data

Dec. 19, 1998 (TW) .................................. 87121256

(51) Int. Cl.$^7$ .......................... H01L 21/336; H01L 21/76
(52) U.S. Cl. ........................ 438/296; 438/404; 438/424
(58) Field of Search ................................. 438/404, 424, 438/296

(56) References Cited

U.S. PATENT DOCUMENTS 5,904,538 * 5/1999 Son et al. .
6,107,159 * 8/2000 Chuang .
6,114,217 * 9/2000 Park .
6,150,072 * 11/2000 Shoda et al. .

* cited by examiner

*Primary Examiner*—John F. Niebling
*Assistant Examiner*—Josetta Jones

(57) ABSTRACT

A method for forming a shallow trench isolation structure. A substrate having a pad oxide layer and a first mask layer is provided. The first mask layer is patterned to form a first opening, a spacer is formed on the first mask layer sidewalls. The patterned first mask layer and the spacer are used as a hard mask, a portion of the pad oxide layer and the substrate are removed to form a shallow trench within the substrate. A liner layer is formed on the shallow trench surface. An insulation layer is deposited over the patterned first mask layer and within the shallow trench. Using the patterned first mask layer as a stop layer, a portion of the insulation layer above the patterned first mask layer surface is removed. Then, the patterned first mask layer and the spacer are removed. A patterned second mask layer having a second opening is formed on the substrate to expose the insulation layer and a portion of the pad oxide layer. The patterned second mask layer is used as a hard mask to remove the portion of the pad oxide layer, and then an oxide layer is formed by thermal oxidation process on the substrate. The second patterned mask layer and the pad oxide layer are removed, and then an isolation structure according to this invention is complete.

19 Claims, 4 Drawing Sheets

METHOD FOR FORMING A SHALLOW TRENCH ISOLATION

CROSS-REFERENCE TO RELATED APPLICATION

This application claims the priority benefit of Taiwan application Ser. No. 87121256, filed Dec. 19, 1998.

BACKGROUND OF THE INVENTION

1. Field of the Invention

The present invention relates to a method for manufacturing a semiconductor device. More particularly, the present invention relates to a method for forming a shallow trench isolation (STI) of a semiconductor device.

2. Description of the Relation Art

An isolation region is formed in an integrated circuit for preventing a short circuit from occurring between adjacent device regions on a substrate. Conventionally, local oxidation of silicon (LOCOS) technique is widely utilized in the semiconductor industry to provide isolation regions on semiconductor device. However, since internal stress is generated and bird's beak encroachment occurs in the isolation structures, LOCOS cannot effectively isolate devices.

The shallow trench isolation (STI) technique has been developed to improve the bird's beak encroachment of the LOCOS so as to achieve an effective isolation structure. Typically, the STI process comprises the steps of using a mask to define and pattern a shallow trench on a substrate by anisotropic etching process, and then filling he shallow trench with oxide for use as a device isolation structure.

FIGS. 1A through 1E are schematic, cross-sectional views showing the progression of the conventional manufacturing steps for a shallow trench isolation structure. Referring to FIG. 1A, a pad oxide layer 102 is formed by thermal oxidation on a substrate 100. The pad oxide layer 102 is used to protect the substrate 100 surface during the whole processes. A silicon nitride layer 104 as a mask layer is formed by low pressure chemical vapor deposition (LPCVD) on the pad oxide layer 102.

Referring to FIG. 1B, a photoresist layer is formed on the silicon nitride layer 104, after which a portion of the silicon nitride layer 104, the pad oxide layer 102 and the substrate 100 are removed by etching to form a trench 112 within the substrate 100 and expose the substrate 100. Then, the photoresist layer is removed from the silicon nitride layer 104.

Referring to FIG. 1C, a liner layer 114 is formed by high temperature thermal oxidation on the trench 112 surface. The liner layer 114 extends to a top corner 140 of the trench 112 and connects with the pad oxide layer 102. An insulation layer 116 is deposited by atmospheric pressure chemical vapor deposition (APCVD) with tetra-ethyl-ortho-silicate (TEOS) as a gas source over the silicon nitride layer 104 and within the trench 112. The insulation layer 116 is made of silicon oxide. A densification step is subsequently performed on the insulation layer 116 at high temperature.

Referring to FIG. 1D, the silicon nitride layer 104 is used as a polishing stop layer, and a portion of the insulation layer 116 above the surface of the silicon nitride layer 104 is removed by chemical mechanical polishing (CMP) to form an insulation layer 116a and expose the silicon nitride layer 104. A surface of the insulation layer 116a surface is level with a surface of the silicon nitride layer 104.

Referring to FIG. 1E, the silicon nitride layer 104 is removed by using a hot phosphoric acid ($H_3PO_4$) to expose the pad oxide layer 102. The pad oxide layer 102 is removed by using hydrogen fluoride (HF) to form a shallow trench isolation structure 117.

The pad oxide layer 102 is removed by isotropic etching, using hydrogen fluoride (HF); however, the isotropic etching has a tendency to etch laterally. After performing the isotropic etching process, a recess 150 occurs, in the top corner 140 (FIG. 1C) of the trench 112 because insulation layer 116a covers the top corner 140 of the trench 112. The recess 105 leads to a kink effect, and the kink effect causes a threshold voltage reduction and leads to generation of a leakage current while forming the corner parasitic MOSFET.

SUMMARY OF THE INVENTION

Accordingly, the present invention is to provide an improved method for forming a shallow trench isolation structure. The method can prevent recess generation and avoid the kink effect induced in the top corner of the shallow trench.

To achieve these and other advantages and in accordance with the purpose of the invention, as embodied and broadly described herein, the invention provides a method for forming a shallow trench isolation structure. A substrate having a pad oxide layer and a first mask layer is provided. The first mask layer is patterned to form a first opening and a spacer is formed on the first mask layer sidewalls. The patterned first mask layer and the spacer are used as a hard mask and a portion of the pad oxide layer and the substrate are removed to form a shallow trench within the substrate. A liner layer is formed on the shallow trench surface. An insulation layer is deposited over the patterned first mask layer and within the shallow trench. Using the patterned first mask layer as a stop layer, a portion of the insulation layer above the patterned first mask layer surface is removed. Then, the patterned first mask layer and the spacer are removed. A patterned second mask layer having a second opening is formed on the substrate to expose the insulation layer and a portion of the pad oxide layer. The patterned second mask layer is used as a hard mask to remove the portion of the pad oxide layer, and then an oxide layer is formed by a thermal oxidation process on the substrate. The second patterned mask layer and the pad oxide layer are removed, and then an isolation structure according to this invention is complete.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which FIGS. 2A through 2F are schematic, cross-sectional views showing the progression of manufacturing steps for a shallow trench isolation according to one preferred embodiment of this invention.

Figure 1A:
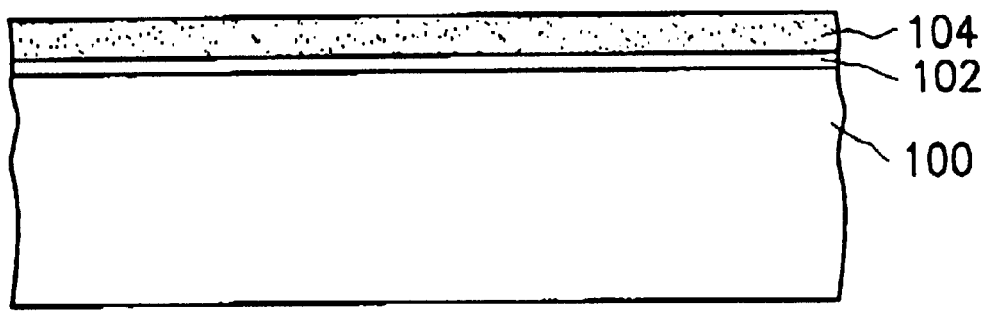
FIGS. 1A through 1E are schematic, cross-sectional views showing the progression of the conventional manufacturing steps for a shallow trench isolation structure.
Figure 1B:
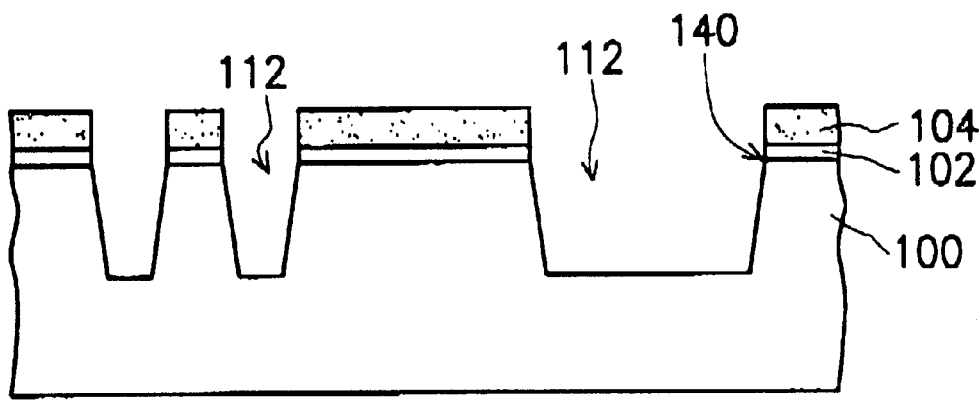
Figure 1C:
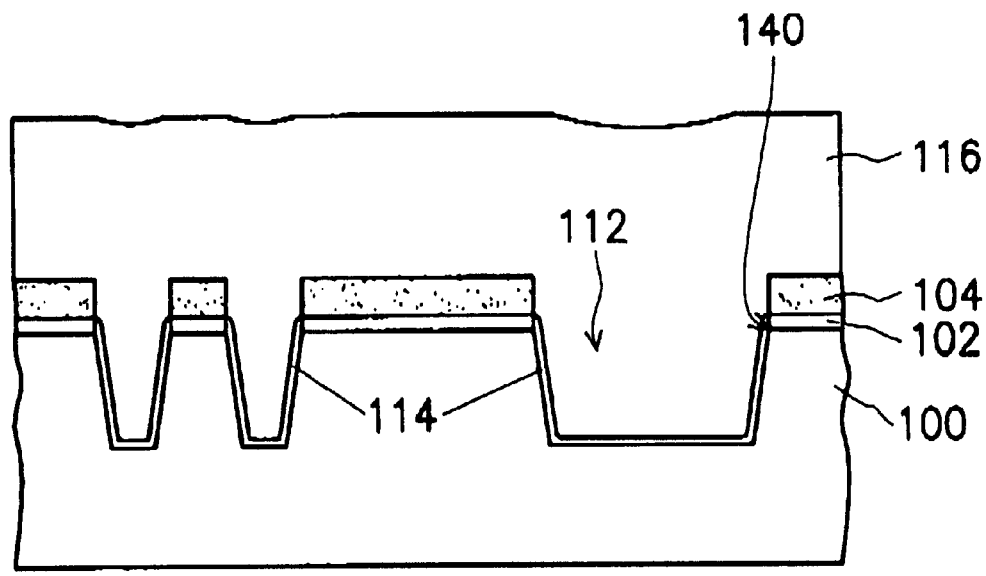
Figure 1D:
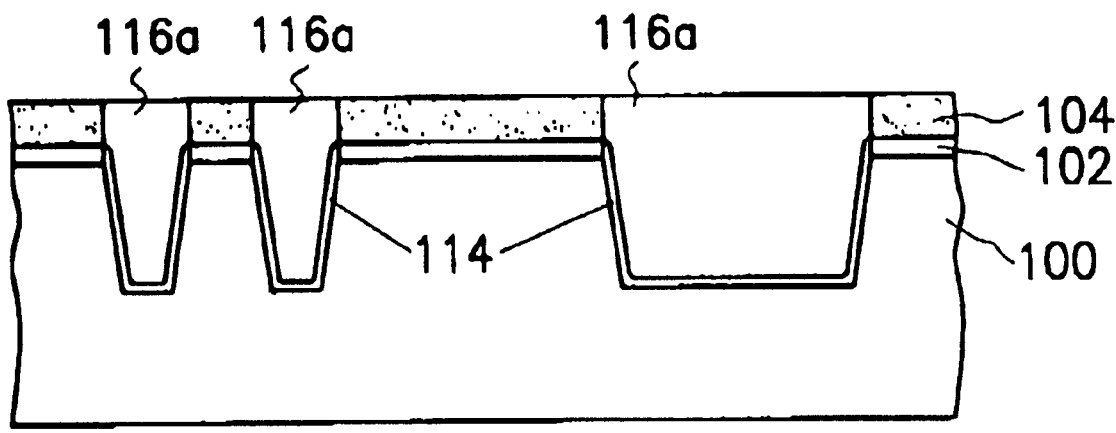
Figure 1E:
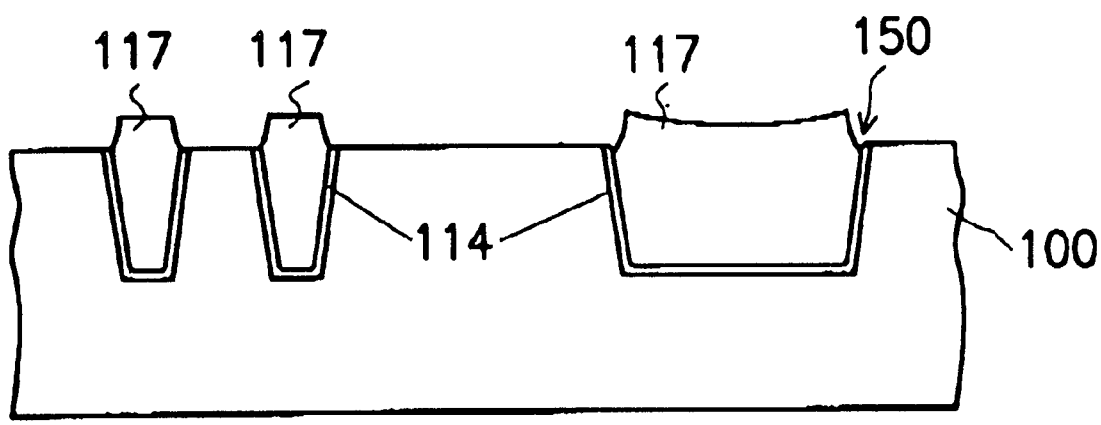
Figure 2A:
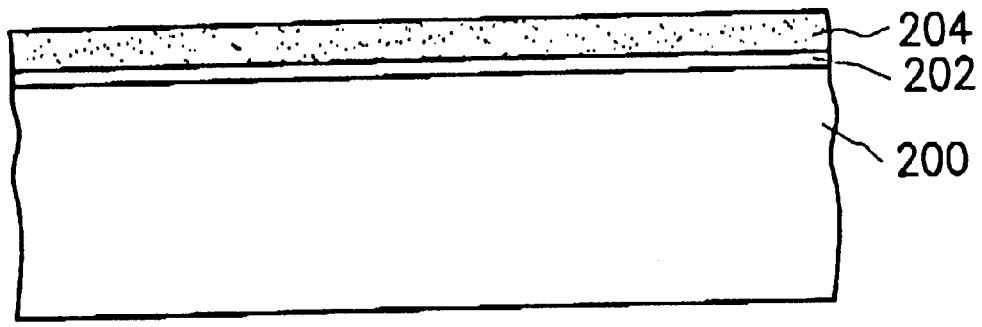
FIGS. 2A through 2F are schematic, cross-sectional views showing the progression of manufacturing steps for a shallow trench isolation according to one preferred embodiment of this invention.

Referring to FIG. 2A, a substrate 200 made of a material such as P-type silicon is provided. A pad oxide layer 202 is formed, for example, by thermal oxidation on the substrate 200 and the pad oxide layer 202 is used to protect the substrate 200 surface during the whole processes. A mask layer 204 made of a material such as silicon nitride is formed, for example, by low pressure chemical vapor deposition (LPCVD) on the pad oxide layer 202.

Figure 2B:
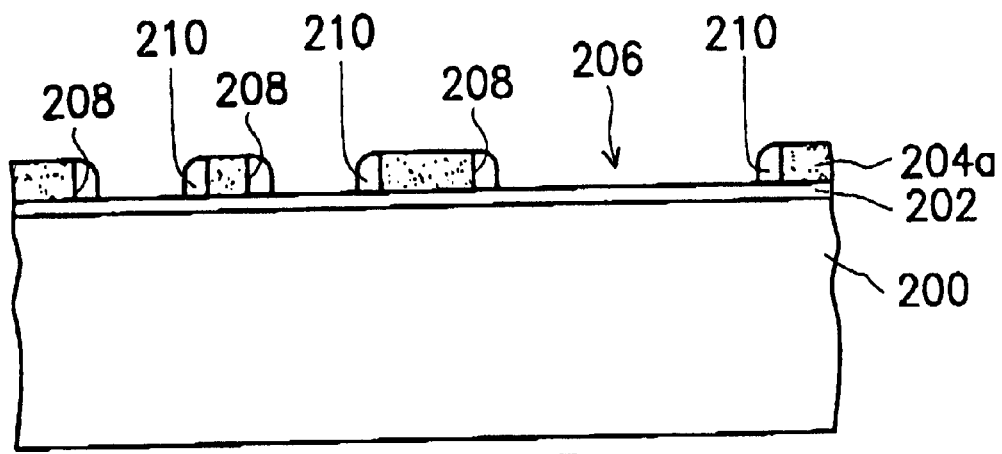

Referring to FIG. 2B, the mask layer 204 is defined to form a patterned mask layer 204a and an opening 206. A dielectric layer made of a material such as silicon nitride is formed, for example, by chemical vapor deposition on the substrate 200. Because the etching rate of the dielectric layer is different from that of the substrate 200, the dielectric layer is etched to form a spacer 210. The spacer 210 made from a material such as silicon nitride is formed, for example, by anisotropic etching on sidewalls 208 of the patterned mask layer 204a.

Figure 2C:
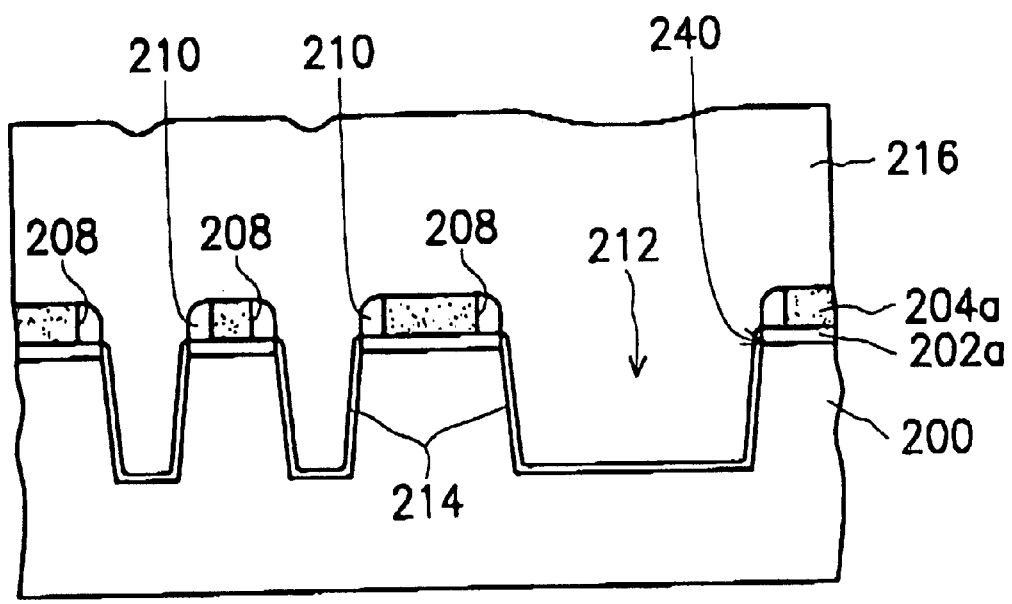

Referring to FIG. 2C, the patterned mask layer 204a and the spacer 210 are used as a hard mask, the pad oxide layer 202 and the substrate 200 are etched by anisotropic etching such as reactive ion etch (RIE) to form a shallow trench 212 within the substrate 200 and a pad oxide layer 202a. A liner layer 214 is formed, for example, by high temperature thermal oxidation, at about 900–1000° C., on the shallow trench 212 surface. The liner layer 214 extends to the top corner 240 of the shallow trench 212 and connects with the pad oxide layer 202a. An insulation layer 216 is deposited, for example, by atmospheric pressure chemical vapor deposition (APCVD) with tetra-ethyl-orthosilicate (TEOS) as a gas source over the patterned mask layer 204a and within the shallow trench 212. The insulation layer 216 is made of a material such as silicon oxide. A densification step is subsequently performed on the insulation layer 216 at a high temperature about 1000° C.; the duration of the process is about 10–30 min.

Figure 2D:
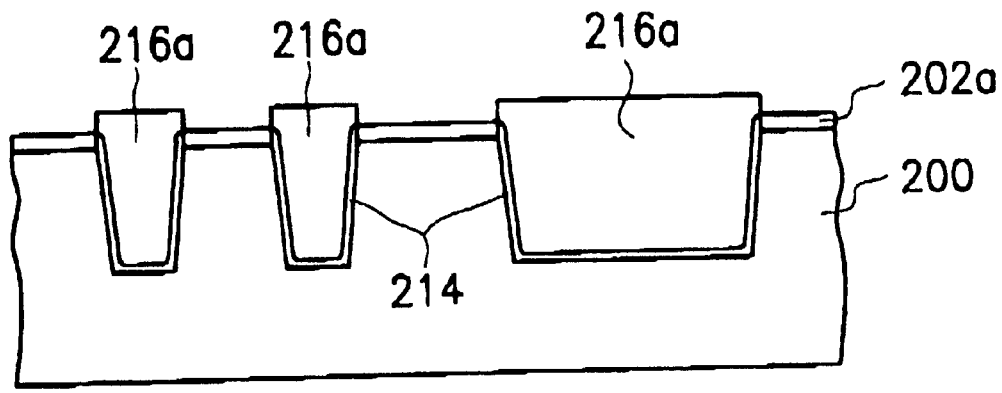

Referring to FIG. 2D, the patterned mask layer 204a is used as a polishing stop layer, a portion of the insulation layer 216 above the patterned mask layer 204a surface is removed, for example, by chemical mechanical polishing (CMP) to form an insulation layer 216a, such as an oxide plug, and expose a surface of the patterned mask layer 204a. The surface of the insulation layer 216a surface is level with the surface of the patterned mask layer 204a. Then, the patterned mask layer 204a and the spacer 210 are removed, for example, by anisotropic etching such as wet etching, using hot phosphoric acid ($H_3PO_4$) as an etchant to expose the pad oxide layer 202a.

Figure 2E:
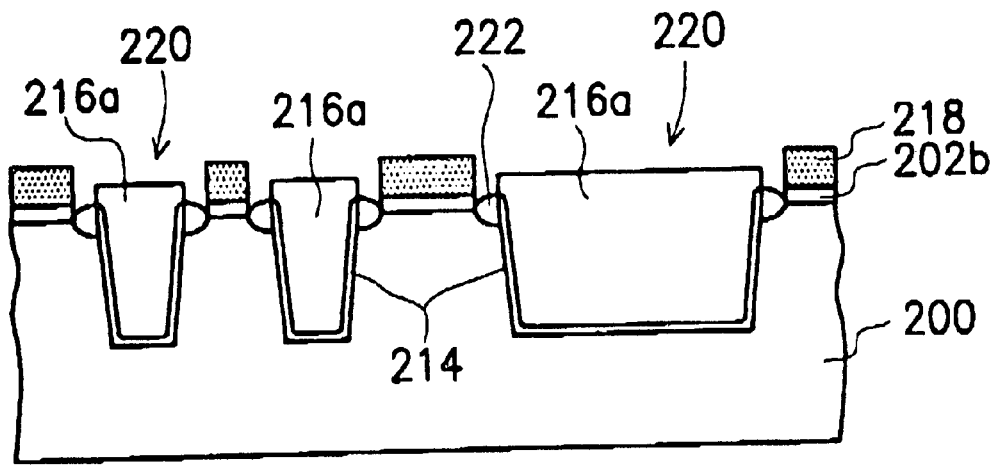

Referring to FIG. 2E, a patterned mask layer 218 having an opening 220 is formed, for example, by chemical vapor deposition on the pad oxide layer 202a, wherein the patterned mask layer 218 has a same pattern as the patterned first mask layer 204a, so that the dimension and the poision of the patterned mask layer 218 are the same as those of the patterned mask layer 204a. The patterned mask layer 218 is made from a material such as silicon nitride and is not easily permeated by water and oxygen. The width of the opening 220 is longer than that of the shallow trench 212 for exposing the insulation layer 216a and a portion of the pad oxide layer 202a. The patterned mask layer 218 is used as an etching mask, and a portion of the pad oxide layer 202a is removed to expose the substrate 200 and form a pad oxide layer 202b. An oxide layer 222 is formed, for example, by thermal oxidation such as wet oxidation, at about 950–1150° C., on the exposed substrate 200. The oxide layer 222 and the insulation layer 216a constitute an isolation structure.

Figure 2F:
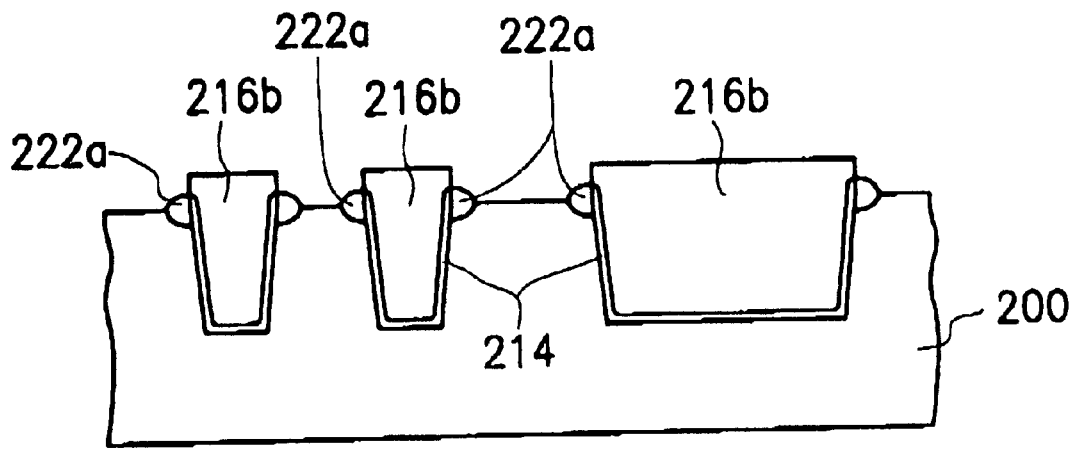

Referring to FIG. 2F, the patterned mask layer 218 and the pad oxide layer 202b are removed, wherein the patterned mask layer 218 is removed by isotropic etching such as wet etching, using a hot phosphoric acid as an etchant, and the pad oxide layer 202b is removed by isotropic etching such as wet etching, using hydrogen fluoride (HF) as an etchant or by anisotropic etching such as dry etching or reactive ion etch to expose the substrate 200. The isotropic etching tends to etch laterally, so that a portion of the oxide layer 222 and the insulation layer 216a are removed after performing the isotropic etching process to form an oxide layer 222a and an insulation layer 216b. Then, a shallow trench isolation structure according to this invention is complete.

One characteristic of this invention is that the oxide layer 222a and the insulation layer 216b constitute an isolation structure. The method easily adjusts the isolation structure size to prevent the bird's beak encroachment in the isolation structures and, in contrast to LOCOS, effectively isolate devices.

Another characteristic of this invention is that it provides the oxide layer 222, which is formed by thermal oxidation. The oxide layer 222 can prevent the recess generated in the top corner of the trench so as to avoid the kink effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a shallow trench isolation, comprising:

providing a substrate;

forming a first mask layer having a pattern exposing a portion of the substrate;

forming a spacer on a sidewall of the first mask layer to reduce the exposed portion of the substrate;

forming a shallow trench in the substrate with the first mask layer and the spacer as a mask;

filling the shallow trench with an insulation layer;

removing the first mask layer and the spacer;

forming a second mask layer having the pattern of the first mask layer, so that the insulation layer and a portion of the substrate around the insulation layer are exposed;

transforming the portion of the substrate around the insulation layer into an oxide layer; and removing the second mask layer.

2. The method of claim 1, further comprising a step of forming a pad oxide layer on the substrate before the step of forming the first mask layer.

3. The method of claim 2, wherein the spacer, the pad oxide layer and the substrate have different etching rates.

4. The method of claim 1, wherein the spacer includes silicon nitride.

5. The method of claim 1, further comprising a step of forming a liner layer on he shallow trench surface before the step of filling the shallow trench with the insulation layer.

6. The method of claim 2, further comprising a step of forming a liner layer on the shallow trench surface before the step of filling the shallow trench with the insulation layer, wherein the liner layer extends to a top corner of the shallow trench and connects with the pad oxide layer.

7. A method for forming a shallow trench isolation, the method comprising the steps of:

provingd a substrate;

forming a first mask layer, wherein the first mask layer has a first opening to expose a part the substrate;

forming a spacer on a sidewall of the first opening to narrow down the part of the substrate exposed by the first opening;

removing the exposed portion of the substrate, so as to form a shallow trench;

filling the shallow trench with an insulation layer;

removing the first mask layer and the spacer;

forming a second mask layer on the substrate with a second opening, wherein the second opening having a same dimension and a same position as the first opening;

performing an oxidation process; and removing the second mask layer.

8. The method of claim 7, wherein the first mask layer includes a silicon nitride layer.

9. The method of claim 7, further comprising a step of forming a pad oxide layer on the substrate before the step of forming the first mask layer.

10. The method of claim 9, wherein the spacer, the pad oxide layer and the substrate have different etching rates.

11. The method of claim 7, wherein the spacer includes silicon nitride.

12. The method of claim 7, further comprising a step of forming a liner layer on the shallow trench surface before the step of filling the shallow trench with the insulation layer.

13. The method of claim 9, further comprising a step of forming a liner layer on the shallow trench surface before the step of filling the shallow trench with an insulation layer, wherein the liner layer extends to a top corner of the shallow trench and connects with the pad oxide layer.

14. The method of claim 7, wherein the step of forming the spacer further comprising:

forming a dielectric layer on the substrate; and performing an etching back process to leave the spacer on the side wall of the first opening.

15. The method of claim 14, wherein the dielectric layer includes a silicon nitride layer.

16. The method of claim 7, wherein the insulation layer includes a silicon oxide layer.

17. The method of claim 7, wherein the step of removing the portion of the insulation layer includes using chemical mechanical polishing.

18. The method of claim 7, wherein the step of removing the first mask layer and the spacer includes using isotropic etching.

19. The method of claim 7, wherein the second mask layer includes a silicon oxide layer.

* * * * *